(12) United States Patent
Choi et al.

(10) Patent No.: US 8,274,090 B2
(45) Date of Patent: Sep. 25, 2012

(54) ORGANIC LIGHT-EMITTING DISPLAY DEVICE

(75) Inventors: Jun-Ho Choi, Yongin (KR); Jin-Koo Chung, Yongin (KR); Chan-Young Park, Yongin (KR); Sung-Min Kim, Yongin (KR); Young-Woo Song, Yongin (KR); Sung-Chul Kim, Yongin (KR); Jae-Heung Ha, Yongin (KR); Kyu-Hwan Hwang, Yongin (KR); Seok-Gyu Yoon, Yongin (KR); Jong-Hyuk Lee, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/177,414

(22) Filed: Jul. 6, 2011

(65) Prior Publication Data

US 2012/0049206 A1    Mar. 1, 2012

(30) Foreign Application Priority Data

Aug. 24, 2010   (KR) .................. 10-2010-0082099

(51) Int. Cl.
*H01L 33/62* (2010.01)
(52) U.S. Cl. ................... 257/88; 257/E51.018
(58) Field of Classification Search ............ 257/88, 257/E51.018, E51.022, 79, 82, 83
See application file for complete search history.

(56) References Cited

U.S. PATENT DOCUMENTS

| 6,921,918 | B2* | 7/2005 | Park et al. ................. 257/72 |
| 6,989,571 | B2* | 1/2006 | Park et al. ................ 257/350 |
| 7,358,529 | B2* | 4/2008 | Childs et al. ............... 257/59 |
| 2003/0155860 | A1* | 8/2003 | Choi et al. ................ 313/498 |
| 2004/0000863 | A1 | 1/2004 | Miyake |
| 2012/0168761 | A1* | 7/2012 | Park et al. ................. 257/59 |

FOREIGN PATENT DOCUMENTS

| JP | 10-039757 | 2/1998 |
| JP | 2005-345946 | 12/2005 |
| KR | 10-2005-0009838 A | 1/2005 |
| KR | 10-2005-0072310 A | 7/2005 |

* cited by examiner

*Primary Examiner* — Thao P. Le
(74) *Attorney, Agent, or Firm* — Christie, Parker & Hale, LLP

(57) ABSTRACT

An organic light-emitting display device includes: a substrate; pixels on a first side of the substrate, each of the pixels comprising a first region for emitting light and a second region for transmitting external light; pixel circuits on the first regions of the pixels, each of the pixel circuits comprising at least one thin film transistor; an insulating layer covering the pixel circuits; first electrodes on the insulating layer, spaced from each other on the first regions, and electrically connected to the pixel circuits; a second electrode opposite the first electrodes and formed throughout the first and second regions of all the pixels; an organic layer between the first electrodes and the second electrode; a sealing member facing the first side of the substrate; and an anti-reflection layer located on at least one of a second side of the substrate or an outer side of the sealing member.

20 Claims, 10 Drawing Sheets

ORGANIC LIGHT-EMITTING DISPLAY DEVICE

CROSS-REFERENCE TO RELATED PATENT APPLICATION

This application claims priority to and the benefit of Korean Patent Application No. 10-2010-0082099. filed on Aug. 24, 2010. in the Korean Intellectual Property Office, the disclosure of which is incorporated herein in its entirety by reference.

BACKGROUND

1. Field

Embodiments of the present invention relate to an organic light-emitting display device.

2. Description of the Related Art

Organic light-emitting display devices have characteristics such as wide viewing angles, high contrast, fast response speeds, and low power consumption, and are being widely applied to personal portable devices such as MP3 players, mobile phones, and TVs.

Recently, researchers have tried to make organic light-emitting display devices into transparent display devices by including (or forming) a transparent thin film transistor or a transparent organic light-emitting diode in the organic light-emitting display devices.

However, in the transparent display devices, when the organic light-emitting display devices are in switch-off status, objects or images located on an opposite side of a user are seen by the user through the thin film transistors, as well as through patterns created by, for example, wires, spaces between the patterns, and transparent organic light-emitting devices. Although the organic light-emitting display device may be a transparent display device, light transmittance of the thin film transistors and various wires is not very high, and there is little space between the wires, and thus, light transmittance of the transparent display device is not high.

SUMMARY

Embodiments of the present invention provide an organic light-emitting display device having a high external light transmittance.

According to an embodiment of the present invention, there is provided an organic light-emitting display device comprising: a substrate; a plurality of pixels on a first side of the substrate, each of the pixels comprising a first region for emitting light and a second region for transmitting external light; a plurality of pixel circuits on the first regions of the pixels, each of the pixel circuits comprising at least one thin film transistor; an insulating layer covering the pixel circuits; a plurality of first electrodes on the insulating layer, spaced from each other on the first regions of the pixels, and electrically connected to the pixel circuits; a second electrode opposite the first electrodes and formed throughout the first and second regions of all the pixels; an organic layer between the first electrodes and the second electrode; a sealing member facing the first side of the substrate; and an anti-reflection layer located on at least one of a second side of the substrate or an outer side of the sealing member.

At least one of the first electrodes may be a light-transmitting electrode.

At least one of the first electrodes may be a reflective electrode.

The second electrode may have a plurality of first transmission windows on portions corresponding to the second regions.

The first transmission windows may be spaced from each other on the pixels.

The first transmission windows on at least two adjacent pixels of the plurality of pixels may be connected to each other.

The insulating layer may have a plurality of second transmission windows corresponding to the first transmission windows.

The first region in each of the pixels may include an emission region and a circuit region, the at least one thin film transistor may be in the circuit region, at least one of the first electrodes may be in the emission region, and the emission region and the circuit region in each of the pixels may be adjacent to each other.

The first region in each of the pixels may include an emission region and a circuit region, the pixel circuit may be in the circuit region, at least one of the first electrodes may be in the emission region, and the emission region in each of the pixels may overlap and cover the circuit region.

An area of at least one of the first electrodes in each of the pixels may be substantially equal to an area of the first region.

According to another embodiment of the present invention, there is provided an organic light-emitting display device comprising: a substrate; a plurality of pixels on a first side of the substrate, each of the pixels comprising a first region for emitting light and a second region for transmitting external light; a plurality of thin film transistors on the first regions of the pixels; a plurality of first electrodes on the first regions of the pixels, and electrically connected to the thin film transistors; a second electrode opposite the first electrodes and formed throughout all the pixels; an organic layer between the first electrodes and the second electrode; a sealing member facing the first side of the substrate; and an anti-reflection layer located on at least one of a second side of the substrate or an outer side of the sealing member.

At least one of the first electrodes may be a light-transmitting electrode.

At least one of the first electrodes may be a reflective electrode.

The second electrode may have a plurality of first transmission windows on portions corresponding to the second regions.

The first transmission windows may be spaced from each other on the pixels.

The first transmission windows on at least two adjacent pixels of the plurality of pixels may be connected to each other.

The organic light-emitting display device may further include at least one insulating layer on the substrate, and the insulating layer may have a plurality of second transmission windows corresponding to the first transmission windows.

The first region in each of the pixels may include an emission region and a circuit region, the at least one thin film transistor may be in the circuit region, at least one of the first electrodes may be in the emission region, and the emission region and the circuit region in each of the pixels may be adjacent to each other.

The first region in each of the pixels may include an emission region and a circuit region, the pixel circuit may be in the circuit region, at least one of the first electrodes may be in the emission region, and the emission region in each of the pixels may overlap and cover the circuit region.

An area of at least one of the first electrodes in each of the pixels may be substantially equal to an area of the first region.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, embodiments of the present invention will be described in detail with reference to the accompanying drawings.

Figure 1:
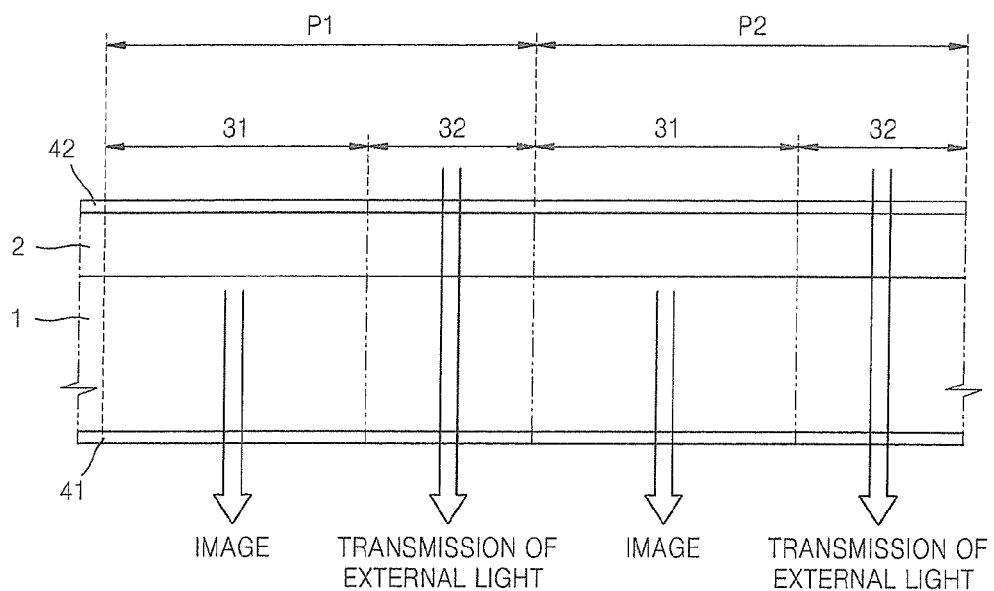
FIG. 1 is a schematic cross-sectional view of an organic light-emitting display device according to an embodiment of the present invention.

FIG. 1 is a schematic cross-sectional view of an organic light-emitting display device according to an embodiment of the present invention.

Referring to FIG. 1, the organic light-emitting display device of the present embodiment includes a display unit 2 on a substrate 1.

In the organic light-emitting display device, external light is incident through the substrate 1 and the display unit 2.

Figure 2:
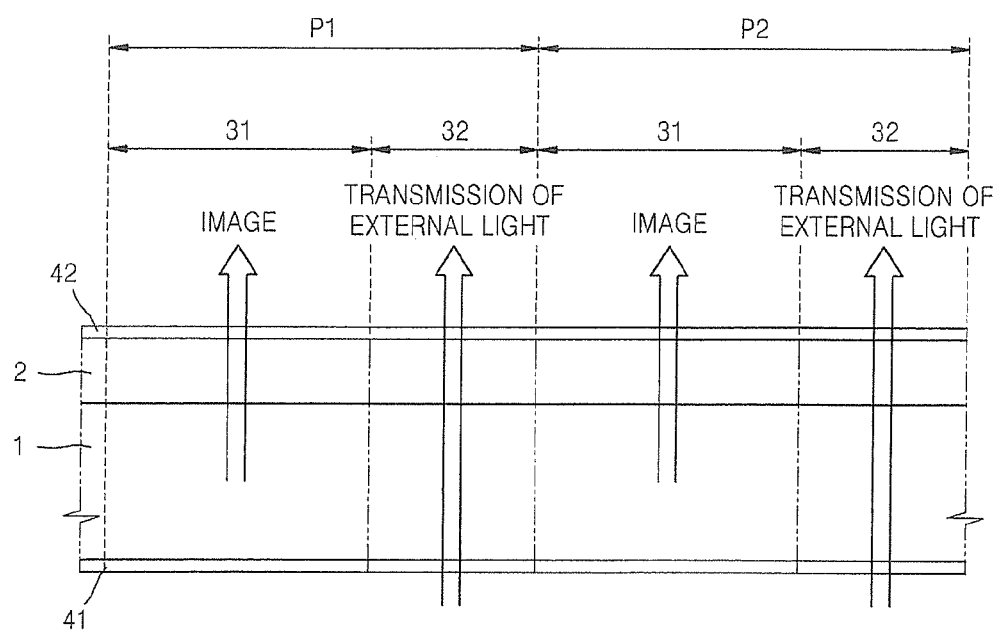
FIG. 2 is a schematic cross-sectional view of an organic light-emitting display device according to another embodiment of the present invention.

In addition, the display unit 2 may be configured to transmit the external light, as will be described later. In FIG. 1, a user located on a side (e.g., a lower side) on which images are displayed may observe external images from an upper side of the substrate 1. The organic light-emitting display device shown in FIG. 1 is a bottom emission type display device in which the images of the display unit 2 are displayed (or realized) toward the substrate 1. However, the present invention is not limited thereto. That is, as shown in FIG. 2, the organic light-emitting display device may be a top emission type display device in which images of the display unit 2 are displayed to a side opposite the substrate 1. Thus, the user may see display images of the display unit 2 from the upper side of the substrate 1 or may observe external images from the lower side of the substrate 1. However, the present invention is not limited to the embodiments of FIG. 1 and FIG. 2, and may be applied to a dual-emission type display device in which the images of the display unit 2 are displayed toward the substrate 1 and to an opposite side of the substrate 1.

FIGS. 1 and 2 show a first pixel P1 and a second pixel P2 that are adjacent to each other in the organic light-emitting display device according to an embodiment of the present invention.

Each of the pixels P1 and P2 includes a first region 31 and a second region 32.

The image of the display unit 2 is displayed through the first region 31, and external light transmits through the second region 32.

That is, according to the present embodiment, each of the pixels P1 and P2 includes the first region 31 for displaying the images and the second region 32 for transmitting the external light, and thus, the user may see external images (e.g., views outside of the display panel transmitted through the panel) when the user does not see the images of the display unit 2.

In one embodiment, in order to increase or maximize an external light transmittance of the second region 32, devices such as a thin film transistor, a capacitor, and an organic light-emitting diode are not formed on the second region 32. Therefore, a total external light transmittance of the display unit 2 may be improved, and distortion of the image caused by interferences from the devices such as the thin film transistor, the capacitor, and the organic light-emitting diode can be reduced or minimized.

Figure 3:
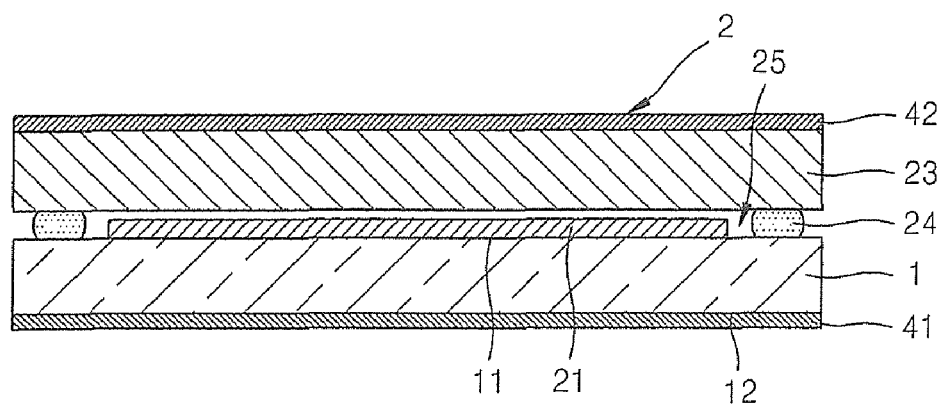
FIG. 3 is a cross-sectional view of the organic light-emitting display device of FIG. 1 or FIG. 2 in more detail.

FIG. 3 shows the organic light-emitting display device of FIG. 1 or FIG. 2 in more detail. In one embodiment, the display unit 2 includes an organic light emission unit 21 formed on a first surface 11 of the substrate 1 and a sealing substrate 23 for sealing the organic light emission unit 21.

The sealing substrate 23 may be formed of a transparent material so as to transmit the images from the organic light emission unit 21 and to prevent external air and moisture from infiltrating into the organic light emission unit 21.

Edges of the substrate 1 and the sealing substrate 23 may be coupled to each other by a sealing material 24, and thus, a space 25 between the substrate 1 and the sealing substrate 23 may be sealed. In the space 25, a moisture absorbent or a filler may be located.

Figure 4:
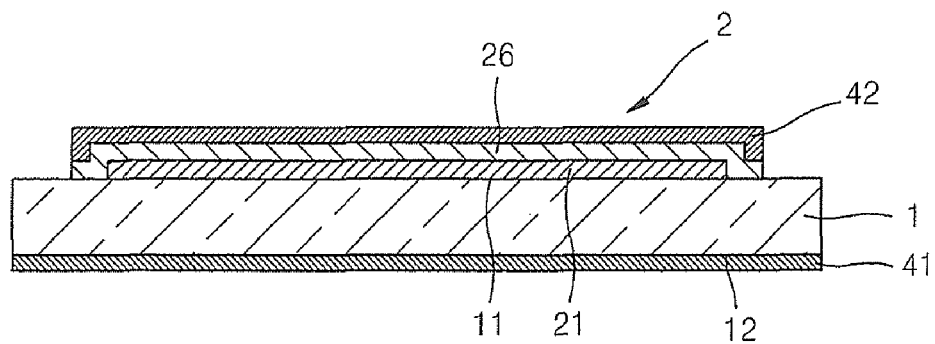
FIG. 4 is a cross-sectional view of the organic light-emitting display device of FIG. 1 or FIG. 2 in more detail.

As shown in FIG. 4, instead of using the sealing substrate 23, a sealing film 26 that is a thin film may be formed on the organic light emission unit 21 to protect the organic light emission unit 21 from the external air. The sealing film 26 may have a structure in which a film formed of an organic material such as silicon oxide or silicon nitride and a film formed of an organic material such as epoxy or polyimide are alternately formed. However, the present invention is not limited thereto, and a sealing structure formed as a transparent thin film may be used.

Although not shown in FIGS. 3 and 4, the sealing film 26 of FIG. 4 may be formed in addition to the sealing substrate 23 of FIG. 3 to seal the organic light emission unit 21.

A first anti-reflection layer 41 and a second anti-reflection layer 42 for preventing the external light from reflecting may be respectively formed on a lower surface of the substrate 1, that is, on a second surface 12, and on an upper outer surface of the display unit 2. It is not necessary to form both of the first and second anti-reflection layers 41 and 42, and at least one of the first and second anti-reflection layers 41 and 42 may be formed.

As described above, the organic light-emitting display device of the present embodiment can increase the external light transmittance of the entire display unit 2 by increasing or maximizing the external light transmittance of the second region 32. However, when light is perpendicularly incident from one medium to another medium, surface reflection of the light can occur due to a difference between refractive indexes.

For example, when the external light is incident from a lower outer side of the substrate 1 into the substrate 1, there is a large (or huge) difference between the refractive index of the substrate 1, which is about 1.5, and the refractive index of air, which is about 1.0, and thus, a surface reflection of about 4% can occur.

The external light transmittance can be determined according to a reflectance of the external light assuming that a degree of absorption of the external light in the second region 32 can be ignored. For example, the higher the reflectance of the external light is in the second region 32, the lower the transmittance of the external light is. Therefore, in the present embodiment, the reflectance of the external light in the second region 32 can be reduced by using the first and second anti-reflection layers 41 and 42, and thus, the transmittance of the external light can be increased by as much as the amount of reduced reflectance.

The first and second anti-reflection layers 41 and 42 may be formed of an anti-reflection film or an anti-reflection coating layer.

Next, the organic light emission unit 21 will be described in more detail as follows.

Figure 5:
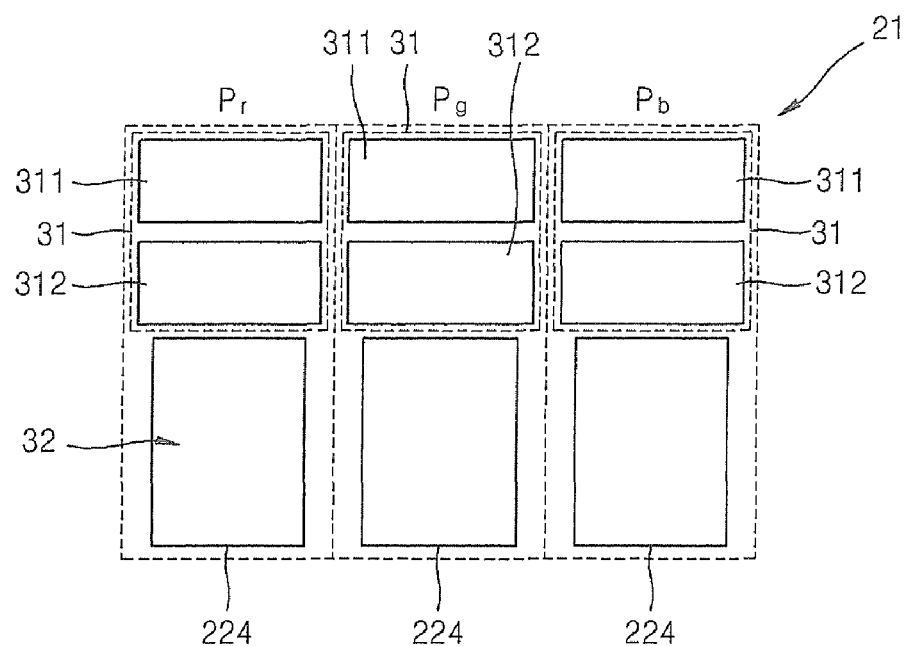
FIG. 5 is a schematic plan view of an organic light emission unit of the organic light-emitting display device shown in FIG. 3 or FIG. 4.

FIG. 5 is a schematic plan view showing a red pixel Pr, a green pixel Pg, and a blue pixel Pb that are adjacent to each other in the organic light emission unit 21 according to the present embodiment.

Each of the red pixel Pr, the green pixel Pg, and the blue pixel Pb includes a first region 31 in which a circuit region 311 and a light emission region 312 are formed. In one embodiment, the circuit region 311 and the light emission region 312 are adjacent to each other.

In addition, a second region 32 through which the external light is transmitted may be located adjacent to the first region 31.

Figure 6:
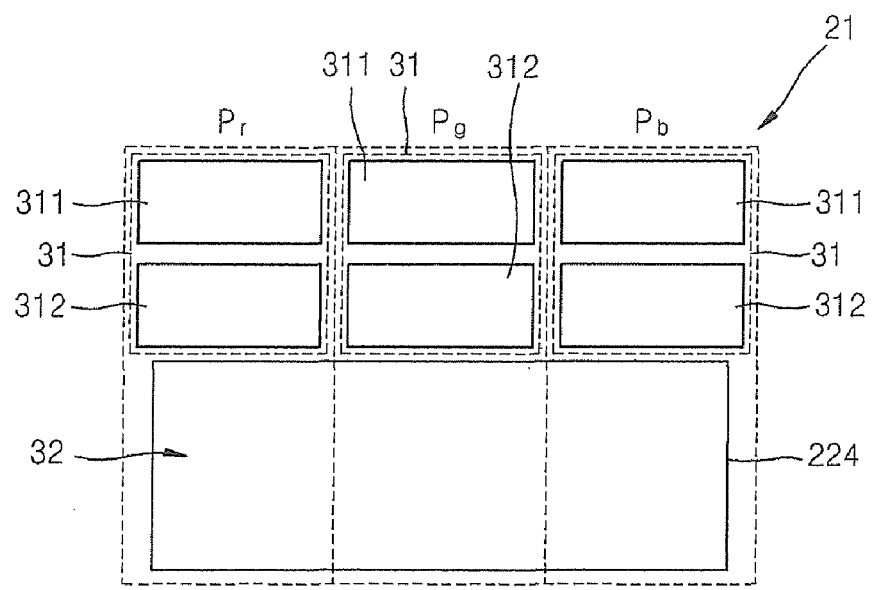
FIG. 6 is a schematic plan view of an organic light emission unit of the organic light-emitting display device shown in FIG. 3 or FIG. 4.

As shown in FIG. 5, the second region 32 may be independently formed on each of the red, green, and blue pixels Pr, Pg, and Pb, or may be formed throughout the red, green, and blue pixels Pr, Pg, and Pb as shown in FIG. 6. In the example shown in FIG. 6, an area of the second region 32, through which the external light is transmitted, is increased, and thus, the entire transmittance of the display unit 2 may be improved.

In FIG. 6, the second regions 32 for the red pixel Pr, the green pixel Pg, and the blue pixel Pb are connected to each other. In other words, the second regions 32 are contiguous and continuous. However, the present invention is not limited to the above example, and the second regions 32 of only two adjacent pixels among the red pixel Pr, the green pixel Pg, and the blue pixel Pb may be connected to each other.

Figure 7:
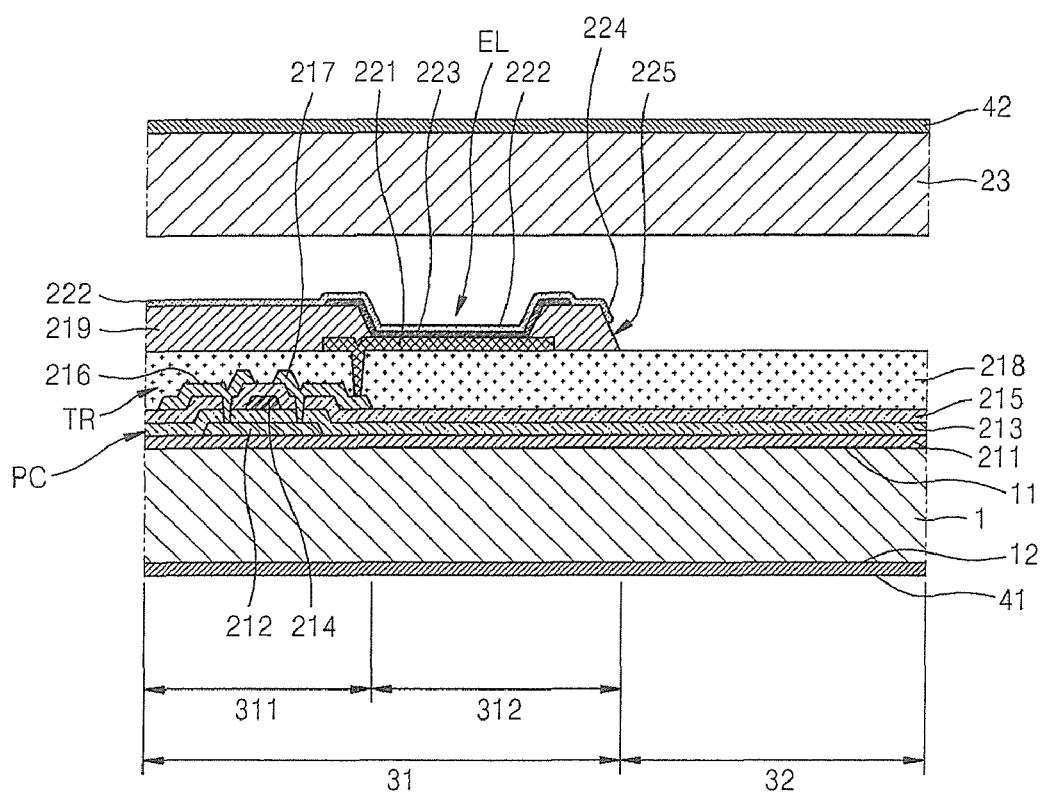
FIG. 7 is a cross-sectional view of a pixel in the organic light emission unit of the organic light-emitting display device shown in FIG. 3 or FIG. 4.

FIG. 7 shows a cross-section of one of the red, green, and blue pixels Pr, Pg, and Pb shown in FIG. 5 or FIG. 6.

As shown in FIG. 7, a thin film transistor TR is located on the circuit region 311, and the present invention is not limited to one thin film transistor TR as shown in FIG. 7. A pixel circuit PC including the thin film transistor TR may be formed. The pixel circuit PC may include a plurality of thin film transistors and storage capacitors, and may further include wires such as scan lines, data lines, and Vdd lines connected to the thin film transistors TR and the storage capacitors.

In one embodiment, the light emission region 312 includes an organic light-emitting device EL (e.g., an organic light emitting diode) that is a light-emitting device. The organic light-emitting device EL is electrically connected to the thin film transistor TR of the pixel circuit PC.

In one embodiment, a buffer layer 211 is formed on the substrate 1, and the pixel circuit PC including the thin film transistor TR is formed on the buffer layer 211.

A semiconductor active layer 212 is formed on the buffer layer 211.

The buffer layer 211 may be formed of a transparent insulating material so as to prevent impurities from infiltrating into the active layer 212 and to planarize a surface of the substrate 1. For example, the buffer layer 211 may be formed of an inorganic material such as silicon oxide, silicon nitride, silicon oxynitride, aluminum oxide, aluminum nitride, titanium oxide, or titanium nitride, an organic material such as polyimide, polyester, or acryl, or a stacked substance thereof. The buffer layer 211 is not an essential element, and thus, if necessary, may not be formed.

The semiconductor active layer 212 may be formed of polycrystalline silicon; however, the present invention is not limited thereto, that is, the semiconductor active layer 212 may be formed of an oxide semiconductor. For example, the semiconductor active layer 212 may be a G-I-Z-O layer [$(In_2O_3)a(Ga_2O_3)b(ZnO)c$ layer] (a, b, c are real numbers satisfying conditions of $a\geqq0$, $b\geqq0$, $c>0$). When the semiconductor active layer 212 is formed of the oxide semiconductor, the light transmittance of the circuit region 311 in the first region 31 may be improved more, and accordingly, the external light transmittance of the entire display unit 2 may be improved.

A gate insulating layer 213 is formed of a transparent insulating material on the buffer layer 211 so as to cover the semiconductor active layer 212, and a gate electrode 214 is formed on the gate insulating layer 213.

An interlayer dielectric 215 is formed of a transparent insulating material on the gate insulating layer 213 so as to cover the gate electrode 214. A source electrode 216 and a gate electrode 217 are formed on the interlayer dielectric 215 so as to contact the semiconductor active layer 212 through holes (e.g., contact holes).

The thin film transistor TR is not limited to the above structure, and the thin film transistor TR may include various structures.

A passivation layer 218 is formed to cover the pixel circuit PC including the thin film transistor TR. The passivation layer 218 may be a single insulating layer or a plurality of insulating layers having a flat upper surface. The passivation layer 218 may be formed of a transparent inorganic insulating material and/or an organic insulating material. The passivation layer 218 may be formed throughout all the pixels.

As shown in FIG. 7, in one embodiment a first electrode 221 of the organic light-emitting device EL, which is electrically connected to the thin film transistor TR, is formed on the passivation layer 218. The first electrode 221 is formed as an island that is independently formed on each of the pixels.

A pixel defining layer 219 formed of an organic and/or inorganic insulating material is formed on the passivation layer 218.

The pixel defining layer 219 covers edge portions of the first electrode 221 and exposes a center portion of the first electrode 221. The pixel defining layer 219 may be formed to cover the first region 31. However, the pixel defining layer 219 may not necessarily cover the entire first region 31, and may cover at least a part, in particular, edge portions of the first electrode 221.

In one embodiment an organic layer 223 and a second electrode 222 are sequentially stacked on the first electrode 221. The second electrode 222 covers the organic layer 223 and the pixel defining layer 219, and is electrically connected throughout all the pixels.

The organic layer 223 may include a low-molecular weight organic layer or a high-molecular weight organic material. When including a low-molecular weight organic layer, the organic layer 223 may have a single or multi-layer structure including at least one layer selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenylbenzidine (NPB), tris-8-hydroxyquinoline aluminum (Alq3), and the like. The low-molecular weight organic layer may be formed by vacuum deposition. In one embodiment, the HIL, the HTL, the ETL, and the EIL are common layers applied commonly to the red, green, and blue pixels Pr, Pg, and Pb.

The first electrode 221 may function as an anode, and the second electrode 222 may function as a cathode. Alternatively, the first electrode 221 may function as a cathode, and the second electrode 222 may function as an anode.

The first electrode 221 may be formed as a transparent electrode, and the second electrode 222 may be formed as a reflective electrode. The first electrode 221 may be formed of indium tin oxide (ITO), indium zinc oxide (IZO), zinc oxide (ZnO), or indium oxide ($In_2O_3$) having a high work function. In addition, the second electrode 222 may be formed of metal having a low work function, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca). Therefore, the organic light-emitting device EL is a bottom emission type display device in which the images are displayed toward the first electrode 221.

However, the present invention is not limited to the above example, and the second electrode 222 may be formed as a transparent electrode.

The passivation layer 218, the gate insulating layer 213, the interlayer dielectric 215, and the pixel defining layer 219 may be formed as transparent insulating layers in order to improve the external light transmittance, as described above.

The sealing substrate 23 may be located on an upper part of the second electrode 222. The sealing substrate 23 may be bonded to the substrate 1 with an additional sealing material 24 on an outer portion of the display unit 2, as shown in FIG. 3, in order to seal the display unit 2 against the external air. An additional filler (not shown) may be located in a space between the sealing substrate 23 and the second electrode 222, or a moisture absorbent may be located thereon. The sealing structure of the display unit 2 is not limited to the sealing substrate 23 shown in FIG. 7, that is, the sealing film structure shown in FIG. 4 may be used.

The second electrode 222 and the pixel defining layer 219 may further include a first transmission window 224 and a second transmission window 225, respectively. The first transmission window 224 may be formed by removing a portion of the second electrode 222, which corresponds to the second region 32, and the second transmission window 225 may be formed by removing a portion of the pixel defining layer 219, which corresponds to the second region 32. The first transmission window 224 and the second transmission window 225 may be connected to each other.

The first transmission window 224 and the second transmission window 225 may be formed as island patterns. That is, as shown in FIG. 5, the first or second transmission window 224 or 225 may be independently formed on each of the red, green, and blue pixels Pr, Pg, and Pb, or as shown in FIG. 6, may be connected throughout the red, green, and blue pixels Pr, Pg, and Pb. In FIG. 6, for example, the first transmission window 224 is connected throughout the red pixel Pr, the green pixel Pg, and the blue pixel Pb; however, the present invention is not limited thereto. That is, the first transmission window 224 may be formed throughout only two adjacent pixels among the red pixel Pr, the green pixel Pg, and the blue pixel Pb. In FIGS. 5 and 6, only the first transmission window 224 is illustrated; however, the second transmission window 225 may be formed in the same pattern as that of the first transmission window 224.

The second transmission window 225 may be further formed on at least one of the passivation layer 218, the interlayer dielectric 215, the gate insulating layer 213, and the buffer layer 211.

According to the present embodiment, it is not necessary to form both of the first transmission window 224 and the second transmission window 225, and only one of the first and second transmission windows 224 and 225 may be formed. For example, the first transmission window 224 may be formed in the second electrode 222 that is formed of metal, in order to improve the external light transmittance.

Figure 8:
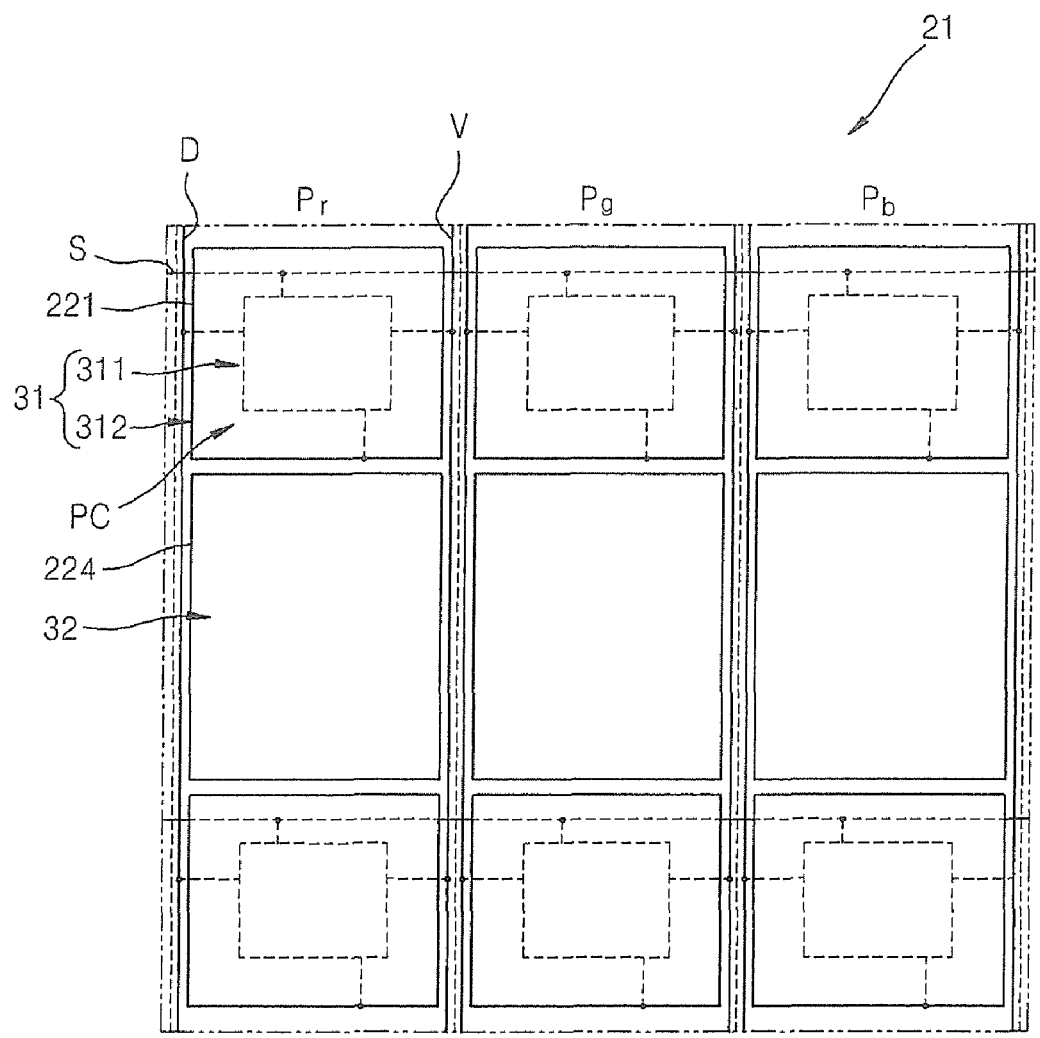
FIG. 8 is a schematic plan view of an organic light emission unit of the organic light-emitting display device shown in FIG. 3 or FIG. 4.

FIG. 8 is a schematic plan view showing a red pixel Pr, a green pixel Pg, and a blue pixel Pb that are adjacent to each other in the organic light emission unit 21 according to the present embodiment.

In the first region 31 of each of the red pixel Pr, the green pixel Pg, and the blue pixel Pb, the circuit region 311 and the light emission region 312 are formed, and the circuit region 311 and the light emission region 312 are disposed overlapping each other. According to the example shown in FIG. 8, an area of the light emission region 312 is greater than that of the pixel circuit PC in the circuit region 311, and thus, the pixel circuit PC in the circuit region 311 is completely covered by the light emission region 312.

The second region 32 for transmitting the external light is adjacent to the first region 31. As shown in FIG. 8, the second regions 32 may be independently formed on each of the red, green, and blue pixels Pr, Pg, and Pb.

In one embodiment, a plurality of conductive lines such as a scan line S, a data line D, and a Vdd line V are electrically connected to the pixel circuit PC. Although not shown in FIG. 8, various conductive lines besides the scan line S, the data line D, and the Vdd line V may be formed according to the structure of the pixel circuit PC.

Figure 9:
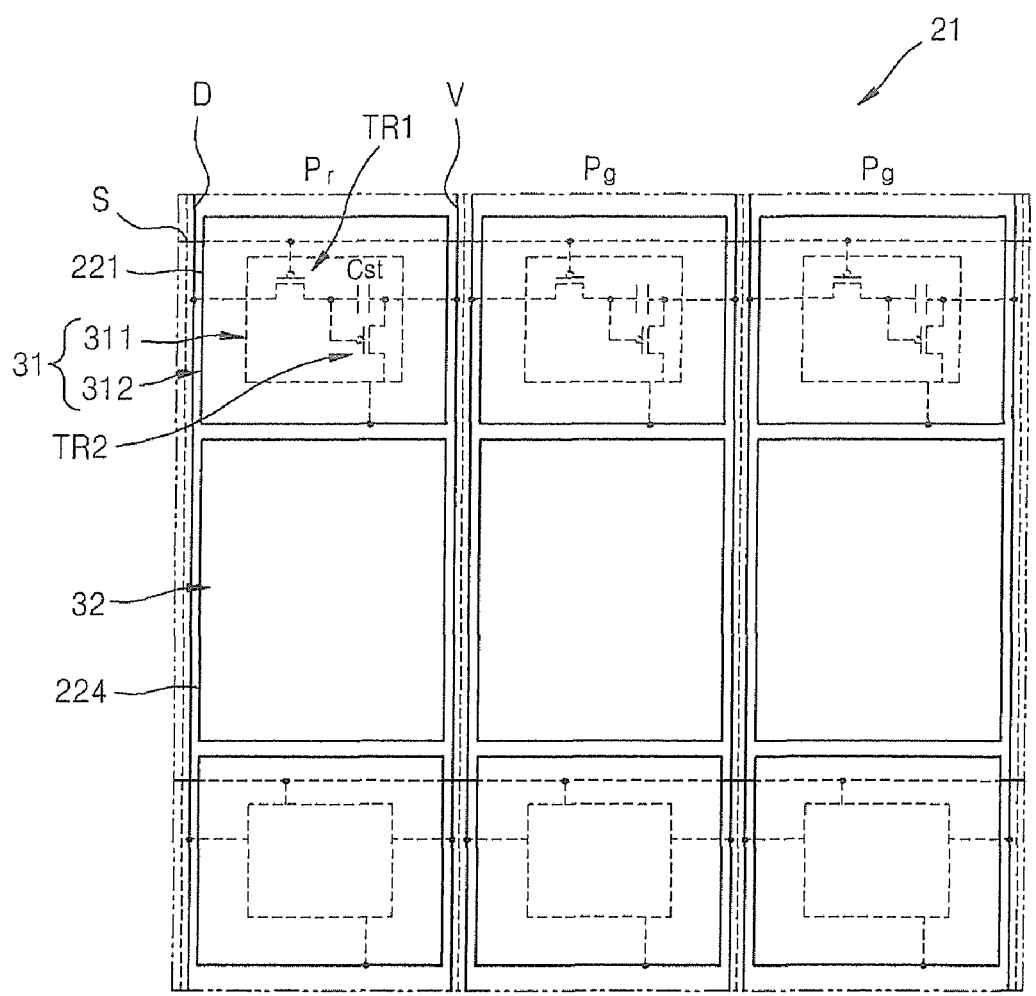
FIG. 9 is a schematic diagram showing a pixel circuit of the organic light emission unit of FIG. 8 in more detail.

FIG. 9 is a schematic diagram showing the pixel circuit PC of FIG. 8 in more detail.

As shown in FIG. 9, in one embodiment the pixel circuit PC includes a first thin film transistor TR1 connected to the scan line S and the data line D, a second thin film transistor TR2 connected to the first thin film transistor TR1 and the Vdd line V, and a capacitor Cst connected to the first and second thin film transistors TR1 and TR2. In one embodiment, the first thin film transistor TR1 functions as a switching transistor, and the second thin film transistor TR2 functions as a driving transistor. The second thin film transistor TR2 is electrically connected to the first electrode 221. In FIG. 9, the first and second thin film transistors TR1 and TR2 are P-type transistors; however, the present invention is not limited thereto. That is, at least one of the first and second thin film transistors TR1 and TR2 may be an N-type transistor. The number of thin film transistors and capacitors is not limited to the above example, and two or more thin film transistors and one or more capacitors may be combined according to the structure of the pixel circuit PC.

Referring to FIGS. 8 and 9, the scan line S is disposed overlapping the first electrode 221. However, the present invention is not limited thereto, and at least one of the plurality of conductive lines including the scan line S, the data line D, and the Vdd line V may be disposed overlapping the first electrode 221. If necessary, all of the plurality of conductive lines including the scan line S, the data line D, and the Vdd line V may be disposed overlapping the first electrode 221 or adjacent to the first electrode 221.

According to an embodiment of the present invention, when the user observes the outside of the display device through the second region 32, distortion of external images, which is generated by the external light scattering due to the patterns of the devices in the pixel circuit PC, may be reduced or prevented by separating the first and second regions 31 and 32.

In one embodiment, the first and second regions 31 and 32 are formed so that a ratio of the area of the second region 32 with respect to a total area of the first and second regions 31 and 32 is within a range of about 5% to about 90%.

If the ratio of the area of the second region 32 with respect to the total area of the first and second regions 31 and 32 is less than 5%, the external light transmitted through the display unit 2 may be too small for the user to see the object or the image located on the opposite side of the user when the display unit 2 is in switched-off status. That is, the display unit 2 may not be transparent. If the area of the second region 32 is about 5% of the total area of the first and second regions 31 and 32, the first region 31 exists as an island and the conductive patterns are disposed in the first region 31 to reduce or minimize the scattering of the external light (e.g., solar light). Thus, the user will recognize the display device as a transparent display device. In addition, when a thin film transistor included in the pixel circuit PC is formed as a transparent transistor such as an oxide semiconductor and the organic light-emitting device EL is formed as a transparent device, the perception by the viewer of the display device as a transparent display device may be increased.

If the ratio of the area of the second region 32 with respect to the total area of the first and second regions 31 and 32 is greater than 90%, a pixel integrity of the display unit 2 may be excessively reduced, and it may be difficult to display images stably with the light emission from the first region 31. That is, as the area of the first region 31 is reduced, the brightness of the light emitted from the organic layer 223, which will be described later, should be increased in order to display images. When the organic light-emitting device EL is operated to maintain a high brightness as above, the lifespan of the organic light-emitting device EL may be sharply reduced. In addition, when the ratio of the area of the second region 32 is greater than 90% while maintaining an appropriate area of the first region 31, the size of the first region 31 is reduced and a resolution of the display unit 2 may be degraded.

Therefore, according to an embodiment of the present invention, the ratio of the area of the second region 32 with respect to the total area of the first and second regions 31 and 32 may be within a range of about 20% to about 70%.

If the ratio is less than 20%, the area of the first region 31 may be excessively large compared to the area of the second region 32, and thus, there may be a limitation on the user's ability to see the external images through the second region 32. If the ratio is greater than 70%, there may be a lot of limitations in designing the pixel circuit PC that is located in the first region 31.

In one embodiment, in the first region 31, the first electrode 221 that is electrically connected to the pixel circuit PC is formed, and the pixel circuit PC is overlapped by the first electrode 221 by being covered by the first electrode 221. In addition, at least one of the conductive lines including the scan line S, the data line D, and the Vdd line V may be disposed to pass over the first electrode 221. Since the conductive lines degrade the transmittance less than the pixel circuit PC does, the conductive lines may be located adjacent to the first electrode 221 according to design conditions. The first electrode 221 may include a reflective layer formed of conductive metal that reflects the light, and thus, the first electrode 221 may cover the pixel circuit PC and the distortion of the external image due to the pixel circuit PC in the first region 31 may be reduced or prevented.

Figure 10:
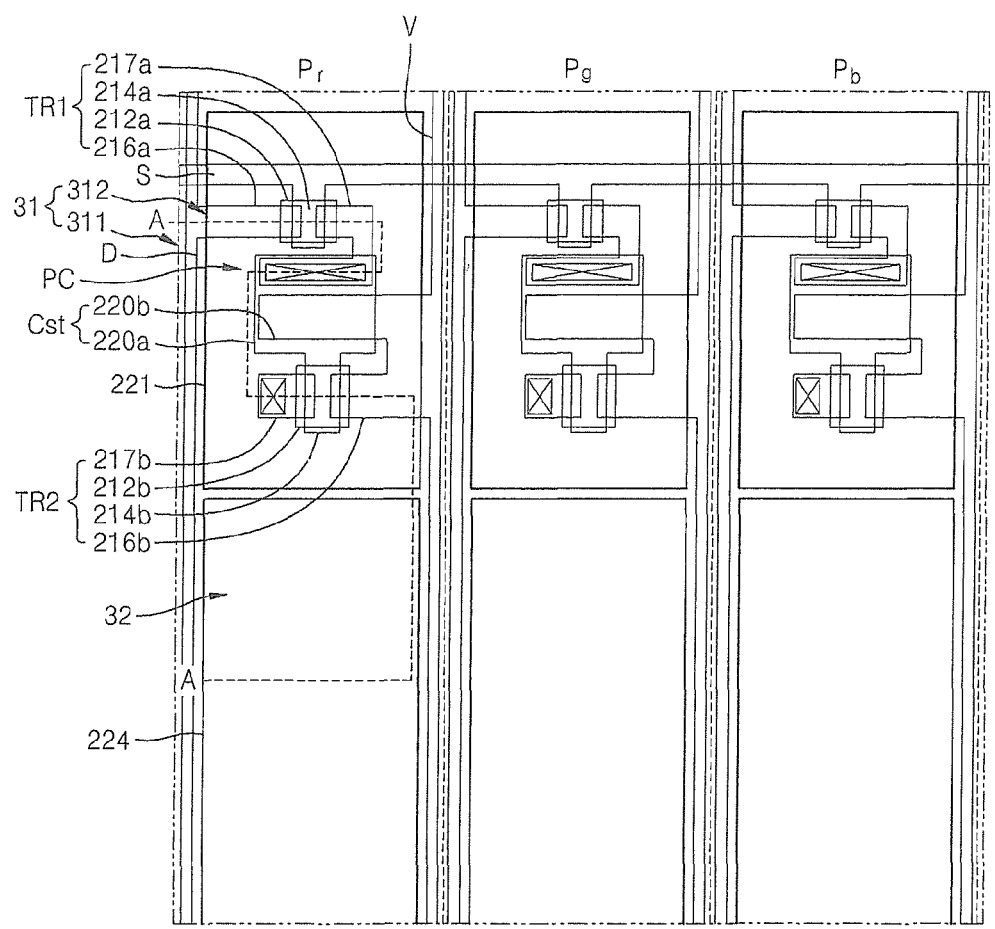
FIG. 10 is a schematic plan view of the organic light emission unit of FIG. 9 in more detail.
Figure 11:
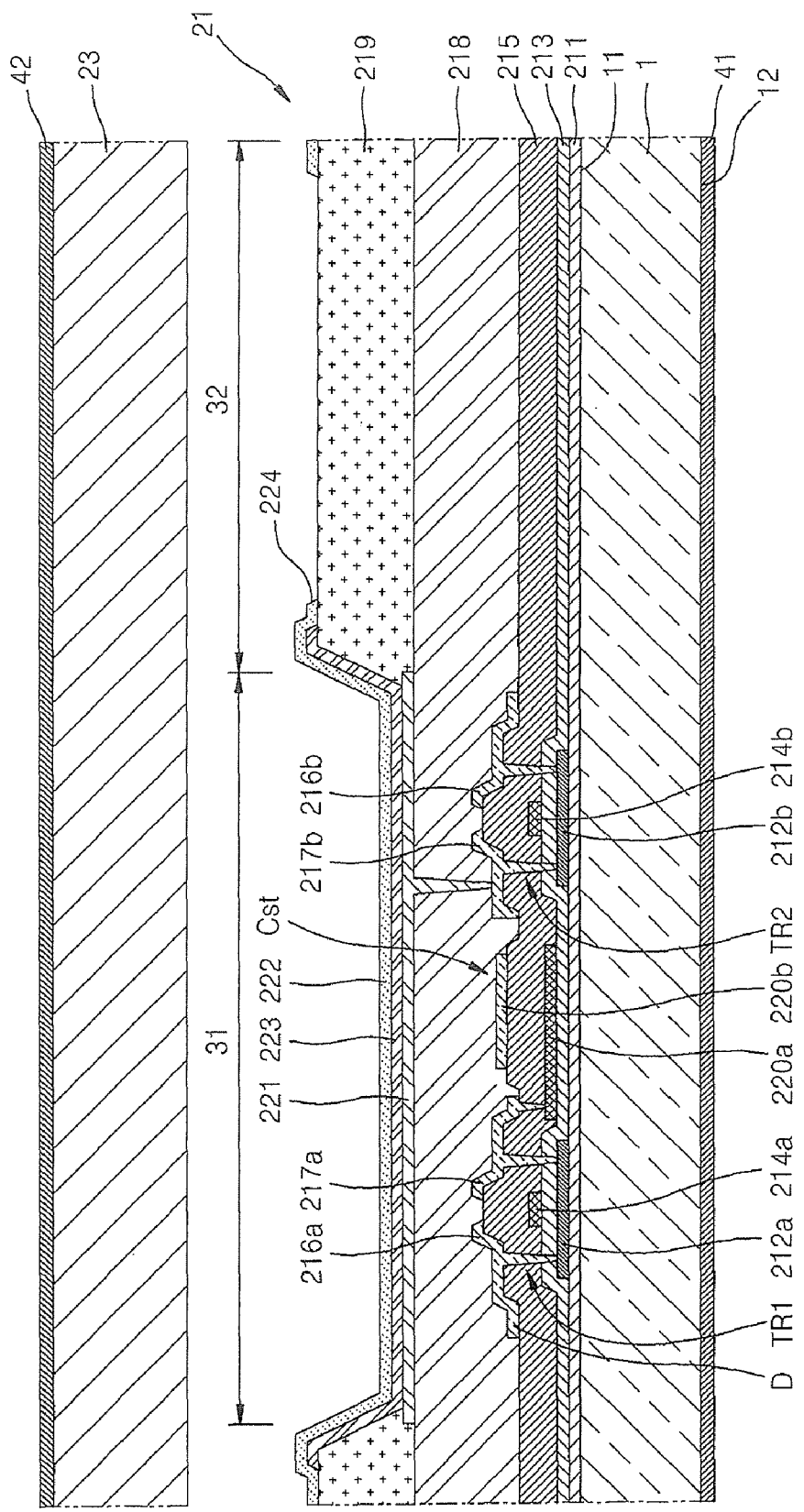
FIG. 11 is a cross-sectional view taken along the line A-A of FIG. 10 according to an embodiment of the present invention.

FIG. 10 is a schematic plan view of the organic light emission unit 21 in more detail, and shows the pixel circuit PC of FIG. 9. FIG. 11 is a cross-sectional view taken along the line A-A of FIG. 10.

Referring to FIGS. 10 and 11, in one embodiment, the buffer layer 211 is formed on the first surface 11 of the substrate 1, and the first thin film transistor TR1, the capacitor Cst, and the second thin film transistor TR2 are formed on the buffer layer 211.

In one embodiment, a first semiconductor active layer 212a and a second semiconductor active layer 212b are formed on the buffer layer 211.

The first and second semiconductor active layers 212a and 212b may be formed of polycrystalline silicon; however, the present invention is not limited thereto, that is, the first and second semiconductor active layers 212a and 212b may be formed of oxide semiconductors. For example, the first and second semiconductor active layers 212a and 212b may include a G-I-Z-O layer [$(In_2O_3)a(Ga_2O_3)b(ZnO)c$ layer](a, b, c are real numbers respectively satisfying conditions of $a \geq 0$, $b \geq 0$, $c > 0$).

The gate insulating layer 213 is formed on the buffer layer 211 so as to cover the first and second semiconductor active layers 212a and 212b. and a first gate electrode 214a and a second gate electrode 214b are formed on the gate insulating layer 213.

The interlayer dielectric 215 is formed on the gate insulating layer 213 so as to cover the first gate electrode 214a and the second gate electrode 214b. A first source electrode 216a and a first drain electrode 217a. and a second source electrode 216b and a second drain electrode 217b are formed on the interlayer dielectric 215 so as to contact the first semiconductor active layer 212a and the second semiconductor active layer 212b. respectively, through holes (e.g., contact holes).

The scan line S may be formed simultaneously with the formation of the first gate electrode 214a and the second gate electrode 214b. In addition, the data line D may be formed simultaneously with the formation of the first source electrode 216a to be connected to the first source electrode 216a. and the Vdd line V may be formed simultaneously with the formation of the second source electrode 216b to be connected to the second source electrode 216b.

In one embodiment, a lower electrode 220a of the capacitor Cst is formed simultaneously with the formation of the first gate electrode 214a and the second gate electrode 214b. and an upper electrode 220b of the capacitor Cst is formed simultaneously with the formation of the first drain electrode 217a.

The structures of the first thin film transistor TR1, the capacitor Cst, and the second thin film transistor TR2 are not limited to the above examples, and various structures of the thin film transistor and the capacitor may be applied. For example, the first thin film transistor TR1 and the second thin film transistor TR2 have top-gate structures; however, they may be formed to have bottom-gate structures in which the first gate electrode 214a and the second gate electrode 214b are respectively located on lower portions of the first semiconductor active layer 212a and the second semiconductor active layer 212b. Of course, other applicable structures of the thin film transistor may be used.

The passivation layer 218 is formed to cover the first thin film transistor TR1, the capacitor Cst, and the second thin film transistor TR2. The passivation layer 218 may be a single insulating or a plurality of insulating layers having a flat upper surface. The passivation layer 218 may be formed of an inorganic material and/or an organic material.

As shown in FIGS. 10 and 11, in one embodiment the first electrode 221 is formed on the passivation layer 218 so as to cover the first thin film transistor TR1, the capacitor Cst, and the second thin film transistor TR2, and the first electrode 221 is connected to the second drain electrode 217b of the second thin film transistor TR2 through a hole (e.g., a via hole) formed in the passivation layer 218. The first electrode 221 is formed in an island pattern that is independently formed on each of the pixels.

In one embodiment, the pixel defining layer 219 is formed on the passivation layer 218 so as to cover the edges of the first electrode 221, and the organic layer 223 and the second electrode 222 are sequentially stacked on the first electrode 221. The second electrode 222 is formed throughout the entire first region 31 and the second region 32.

The first electrode 221 may function as an anode, and the second electrode 222 may function as a cathode. Alternatively, the first electrode 221 may function as a cathode, and the second electrode 222 may function as an anode.

The first electrode 221 may be formed in a size corresponding to the first region 31 in each of the pixels. The second electrode 222 may be formed as a common electrode so as to cover all pixels in the organic light emission unit 21.

According to the present embodiment of the present invention, the first electrode 221 may be formed as a reflective electrode, and the second electrode 222 may be formed as a transparent electrode. Therefore, the organic light emission unit 21 is a top emission type display device in which the images are displayed toward the second electrode 222.

To this end, the first electrode 221 may include a reflective layer formed of, for example, Ag, Mg, Al, Pt, Pd, Au, Ni, Nd, Ir, Cr, Li, Ca, or a compound thereof, and ITO, IZO, ZnO, or $In_2O_3$ having a high work function. In addition, the second electrode 222 may be formed of metal having a low work function, for example, Ag, Mg, Al, Pt, Pd, Au, Ni, Nd, Ir, Cr, Li, Ca, or an alloy thereof. The second electrode 222 may be formed as a thin film in order to improve the light transmittance.

When the first electrode 221 is formed as the reflective electrode, the pixel circuit PC located under the first electrode 221 is covered by the first electrode 221, and accordingly, the user may not see the patterns of the first thin film transistor TR1, the capacitor Cst, and the second thin film transistor TR2 under the first electrode 221, and some parts of the scan line S, the data line D, and the Vdd line V from an upper outer portion of the second electrode 222 in FIG. 11.

In the embodiment described above, since the first electrode 221 is formed as the reflective electrode and the light is only emitted toward the user, that is, toward the upper outer portion of the second electrode 222, the light loss toward the opposite direction of the user may be reduced. In addition, as described above, since the first electrode 221 covers the various patterns of the pixel circuit PC under the first electrode 221, the user may see clear transmitted images.

The passivation layer 218, the gate insulating layer 213, the interlayer dielectric 215, and the pixel defining layer 219 may be formed as transparent insulating layers.

The first transmission window 224 may be formed in the second electrode 222 of the second region 32. The first transmission window 224 may be formed by removing a portion of the second electrode 222 that corresponds to the second region 32. The first transmission window 224 may be formed as an island pattern, as shown in FIG. 10, and may be independently disposed in each of the red, green, and blue pixels Pr, Pg, and Pb.

Figure 12:
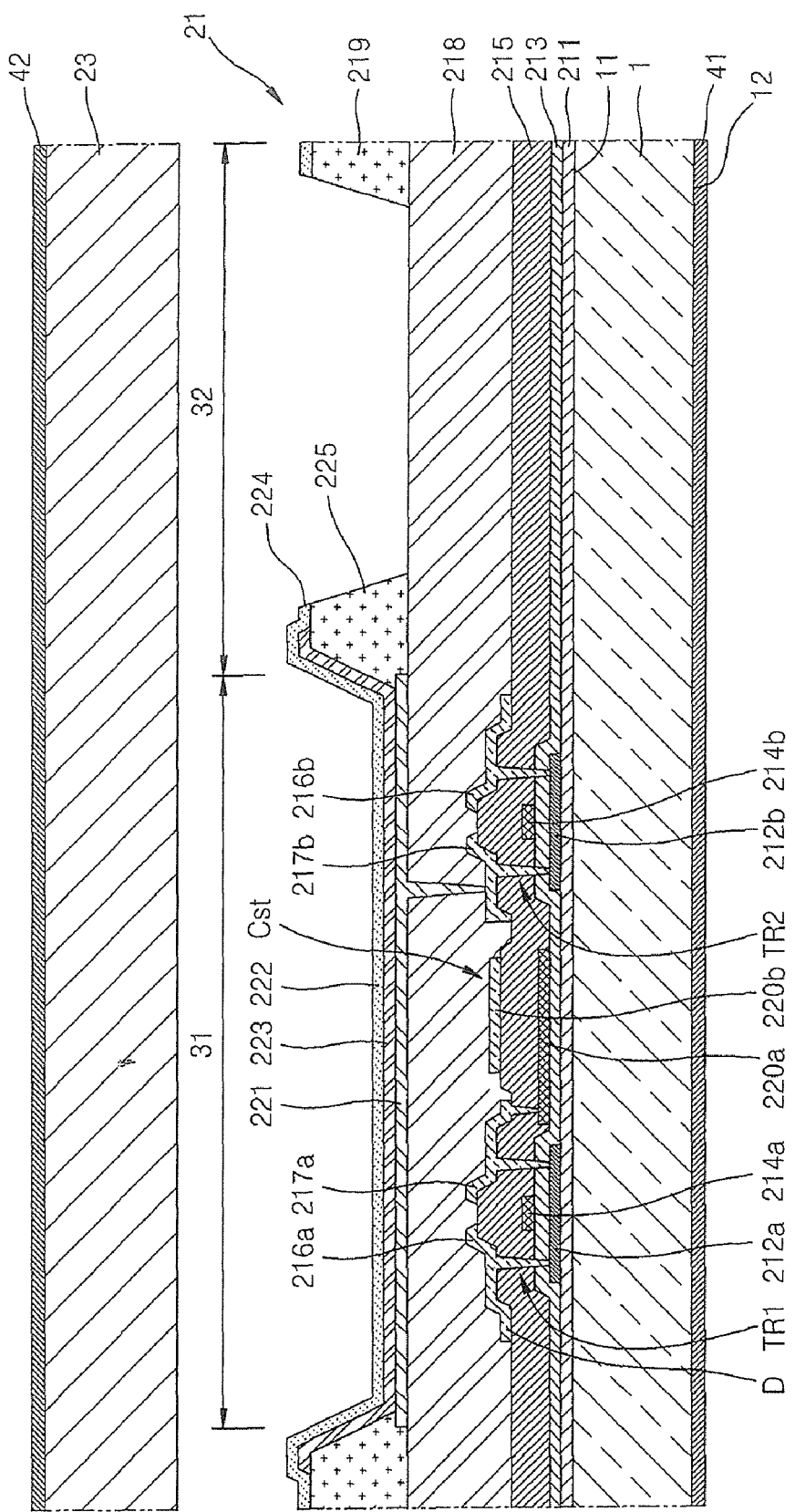
FIG. 12 is a cross-sectional view taken along the line A-A of FIG. 10 according to another embodiment (or example) of the present invention.

FIG. 12 is a cross-sectional view of organic light emission unit 21 according to another embodiment of the present invention, in which the second transmission window 225 is further formed in the pixel defining layer 219. The second transmission window 225 may be formed by removing a portion of the pixel defining layer 219 corresponding to the second region 32. The second transmission window 225 may be connected to the first transmission window 224.

The second transmission window 225 may be formed in an island pattern, as shown in FIG. 10, and the second transmission window 225 may be independently formed in each of the red, green, and blue pixels Pr, Pg, and Pb.

FIG. 10 illustrates the first transmission window 224 only; however, the second transmission window 225 may be formed in the same pattern as the first transmission window 224.

The second transmission window 225 may be further formed in at least one of the passivation layer 218, the interlayer dielectric 215, the gate insulating layer 213, and the buffer layer 211.

According to the present embodiment, it is not necessary to form both the first transmission window 224 and the second transmission window 225, and only one of the first and second transmission windows 224 and 225 may be formed. For example, the first transmission window 224 may be formed in the second electrode 222 that is formed of metal in order to improve the external light transmittance.

Figure 13:
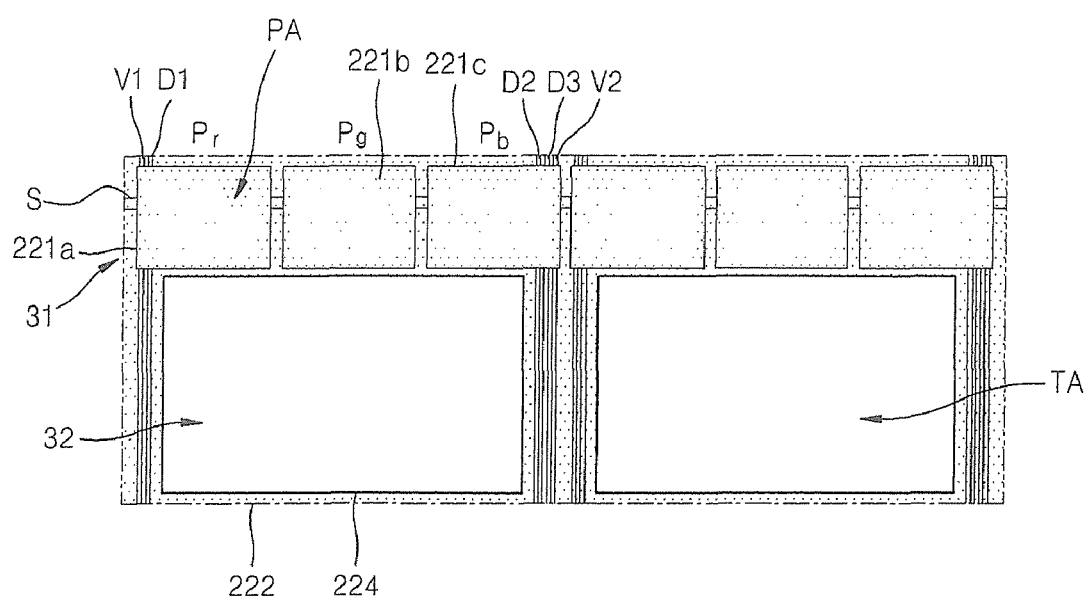
FIG. 13 is a schematic plan view of the organic light emission unit of the organic light-emitting display device of FIG. 3 or FIG. 4.

FIG. 13 is a schematic plan view of an organic light emission unit according to another embodiment of the present invention. A second region 32 is formed to correspond to a first electrode 221a of a red pixel Pr, a first electrode 221b of a green pixel Pg, and a first electrode 221c of a blue pixel Pb. First through third data lines D1 to D3 are electrically connected to the first electrodes 221a, 221b, and 221c of the red, green, and blue pixels Pr, Pg, and Pb. In addition, in one embodiment a first Vdd line V1 is electrically connected to the first electrodes 221a and 221b of the red and green pixels Pr and Pg, and a second Vdd line V2 is electrically connected to the first electrode 221c of the blue pixel Pb.

In this structure, for example, one large second region 32 is formed with respect to three pixels, that is, red, green, and blues pixels Pr, Pg, and Pb, and thus, the light transmittance may be improved and the distortion of the image caused by light scattering may be reduced.

In addition, a first transmission window 224 is formed in the second electrode 222 corresponding to the second region 32, and thus, the light transmittance may be further improved.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. An organic light-emitting display device comprising:
a substrate;
a plurality of pixels on a first side of the substrate, each of the pixels comprising a first region for emitting light and a second region for transmitting external light;
a plurality of pixel circuits on the first regions of the pixels, each of the pixel circuits comprising at least one thin film transistor;
an insulating layer covering the pixel circuits;
a plurality of first electrodes on the insulating layer, spaced from each other on the first regions of the pixels, and electrically connected to the pixel circuits;
a second electrode opposite the first electrodes and formed throughout the first and second regions of all the pixels;
an organic layer between the first electrodes and the second electrode;
a sealing member facing the first side of the substrate; and
an anti-reflection layer located on at least one of a second side of the substrate or an outer side of the sealing member.

2. The organic light-emitting display device of claim 1, wherein at least one of the first electrodes is a light-transmitting electrode.

3. The organic light-emitting display device of claim 1, wherein at least one of the first electrodes is a reflective electrode.

4. The organic light-emitting display device of claim 1, wherein the second electrode has a plurality of first transmission windows on portions corresponding to the second regions.

5. The organic light-emitting display device of claim 4, wherein the first transmission windows are spaced from each other on the pixels.

6. The organic light-emitting display device of claim 4, wherein the first transmission windows on at least two adjacent pixels of the plurality of pixels are connected to each other.

7. The organic light-emitting display device of claim 4, wherein the insulating layer has a plurality of second transmission windows corresponding to the first transmission windows.

8. The organic light-emitting display device of claim 1, wherein the first region in each of the pixels comprises an emission region and a circuit region, the at least one thin film transistor is in the circuit region, at least one of the first electrodes is in the emission region, and the emission region and the circuit region in each of the pixels are adjacent to each other.

9. The organic light-emitting display device of claim 1, wherein the first region in each of the pixels comprises an emission region and a circuit region, the pixel circuit is in the circuit region, at least one of the first electrodes is in the emission region, and the emission region in each of the pixels overlaps and covers the circuit region.

10. The organic light-emitting display device of claim 9, wherein an area of at least one of the first electrodes in each of the pixels is substantially equal to an area of the first region.

11. An organic light-emitting display device comprising:
a substrate;
a plurality of pixels on a first side of the substrate, each of the pixels comprising a first region for emitting light and a second region for transmitting external light;
a plurality of thin film transistors on the first regions of the pixels;
a plurality of first electrodes on the first regions of the pixels, and electrically connected to the thin film transistors;
a second electrode opposite the first electrodes and formed throughout all the pixels;
an organic layer between the first electrodes and the second electrode;
a sealing member facing the first side of the substrate; and
an anti-reflection layer located on at least one of a second side of the substrate or an outer side of the sealing member.

12. The organic light-emitting display device of claim 11, wherein at least one of the first electrodes is a light-transmitting electrode.

13. The organic light-emitting display device of claim 11, wherein at least one of the first electrodes is a reflective electrode.

14. The organic light-emitting display device of claim 11, wherein the second electrode has a plurality of first transmission windows on portions corresponding to the second regions.

15. The organic light-emitting display device of claim 14, wherein the first transmission windows are spaced from each other on the pixels.

16. The organic light-emitting display device of claim 14, wherein the first transmission windows on at least two adjacent pixels of the plurality of pixels are connected to each other.

17. The organic light-emitting display device of claim 14, further comprising at least one insulating layer on the substrate,
wherein the insulating layer has a plurality of second transmission windows corresponding to the first transmission windows.

18. The organic light-emitting display device of claim 11, wherein the first region in each of the pixels comprises an emission region and a circuit region, the at least one thin film transistor is in the circuit region, at least one of the first electrodes is in the emission region, and the emission region and the circuit region in each of the pixels are adjacent to each other.

19. The organic light-emitting display device of claim 11, wherein the first region in each of the pixels comprises an emission region and a circuit region, the pixel circuit is in the circuit region, at least one of the first electrodes is in the emission region, and the emission region in each of the pixels overlaps and covers the circuit region.

20. The organic light-emitting display device of claim 19, wherein an area of at least one of the first electrodes in each of the pixels is substantially equal to an area of the first region.

* * * * *